(12) United States Patent
Tiron et al.

(10) Patent No.: US 9,566,610 B2
(45) Date of Patent: Feb. 14, 2017

(54) METHOD FOR MAKING PATTERNS ON THE SURFACE OF A SUBSTRATE USING BLOCK COPOLYMERS

(75) Inventors: Raluca Tiron, Saint-Martin le Vinoux (FR); Stéphanie Gaugiran, Grenoble (FR); Xavier Chevalier, Grenoble (FR); Serge Tedesco, Corenc (FR)

(73) Assignees: CENTRE NATIONAL DE LA RECHERCHE SCIENTIFIQUE (CNRS), Paris (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 328 days.

(21) Appl. No.: 14/122,576

(22) PCT Filed: May 18, 2012

(86) PCT No.: PCT/EP2012/059295
§ 371 (c)(1),
(2), (4) Date: Feb. 10, 2014

(87) PCT Pub. No.: WO2012/163702
PCT Pub. Date: Dec. 6, 2012

(65) Prior Publication Data
US 2014/0193580 A1 Jul. 10, 2014

(30) Foreign Application Priority Data
May 27, 2011 (FR) ...................................... 11 54675

(51) Int. Cl.
*B05D 5/00* (2006.01)
*B81C 1/00* (2006.01)
(Continued)

(52) U.S. Cl.
CPC ............. *B05D 5/00* (2013.01); *B81C 1/00031* (2013.01); *B81C 2201/0149* (2013.01);
(Continued)

(58) Field of Classification Search
CPC .................. B81C 1/00031; B81C 2201/0159; B81C 2201/0149
See application file for complete search history.

(56) References Cited

U.S. PATENT DOCUMENTS

2008/0274413 A1* 11/2008 Millward ............ B81C 1/00031
430/5
2010/0093172 A1 4/2010 Kim et al.
2013/0011561 A1* 1/2013 Marsh ..................... B32B 25/00
427/282

FOREIGN PATENT DOCUMENTS

WO WO 2009/094282 7/2009

OTHER PUBLICATIONS

Jeong, et al., "Ultralarge-area block copolymer lithography via soft graphoepitaxy," Journal of Materials Chemistry, vol. 21, No. 16, Jan. 1, 2011, pp. 5856-5859.
(Continued)

*Primary Examiner* — Xiao Zhao
(74) *Attorney, Agent, or Firm* — Pillsbury Winthrop Shaw Pittman LLP

(57) ABSTRACT

A method for making patterns on the surface of a substrate by graphoepitaxy, includes depositing a layer of resin on the surface of the substrate; making patterns in the resin on the surface of a substrate; curing the patterns in the resin by producing a layer of amorphous carbon on the surface of the patterns in the resin; depositing a layer of statistical copolymer after curing the patterns in the resin; grafting the layer of statistical copolymer onto the patterns in the resin by annealing; and depositing a layer of a block copolymer into
(Continued)

the spaces defined by the patterns in the resin after curing the patterns and the grafting of the layer of statistical copolymer.

13 Claims, 3 Drawing Sheets

(51) Int. Cl.
    *H01L 21/027*     (2006.01)
    *H01L 21/033*     (2006.01)

(52) U.S. Cl.
    CPC .. *B81C 2201/0159* (2013.01); *H01L 21/0273* (2013.01); *H01L 21/0337* (2013.01)

(56) References Cited

OTHER PUBLICATIONS

Han et al., "Graphoepitaxial assembly of symmetric block copolymers on weakly preferential substrates," Advanced Materials, vol. 22, 2010, pp. 4325-4329.

Cheng et al., "Simple and Versatile Methods to Integrate Directed Self-Assembly with Optical Lithography Using a Polarity-Switched Photoresist," ACS Nano, vol. 4, No. 8, Aug. 24, 2010, pp. 4815-4823.

Kim, et al., "Surface Patterns from block copolymer self-assembly," Journal of Vacuum Science and Technology: Part A, AVS/AIP, vol. 26, No. 6, Nov./Dec. 2008, pp. 1369-1382.

Xiao, et al., "Graphoepitaxial cylindrical block copolymer nanodomains evaluated as bit patterned media template," Journal of Vacuum Science and Technology: Part B, AVS/AIP, vol. 25, No. 6, Nov./Dec. 2007, pp. 1953-1957.

Welander, et al., "Impact of trench width roughness on the graphoepitaxial assembly of block copolymers," Journal of Vacuum Science and Technology: Part B, AVS/AIP, vol. 26, No. 6, Nov./Dec. 2008, pp. 2484-2488.

Mansky, et al., "Controlling Polymer-Surface Interactions with Random Copolymer Brushes," Science, vol. 275, Mar. 7, 1997, pp. 1458-1460.

International Search Report as issued for PCT/EP2012/059295, dated Jun. 19, 2012.

* cited by examiner

Fig. 1
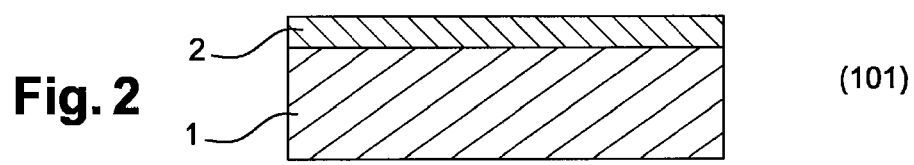
Fig. 2 (101)
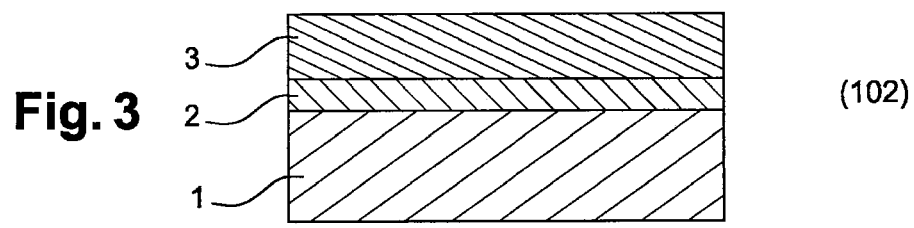
Fig. 3 (102)
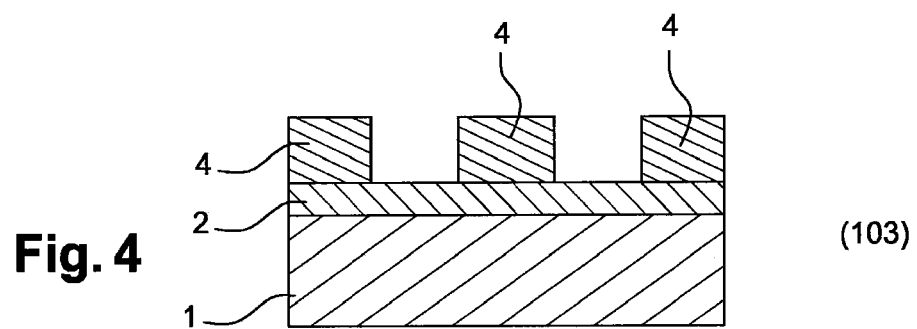
Fig. 4 (103)

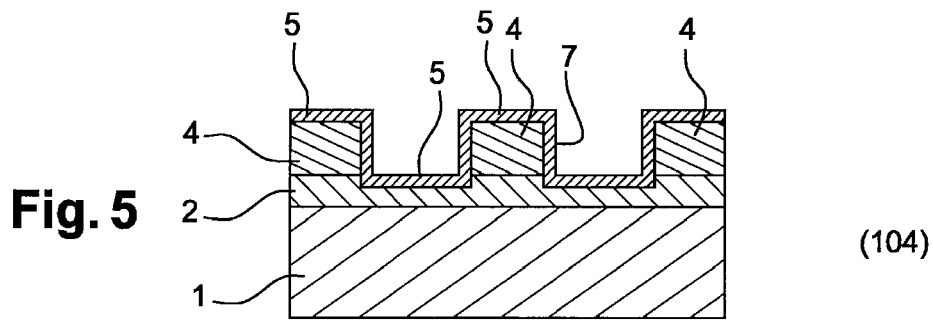
Fig. 5 (104)
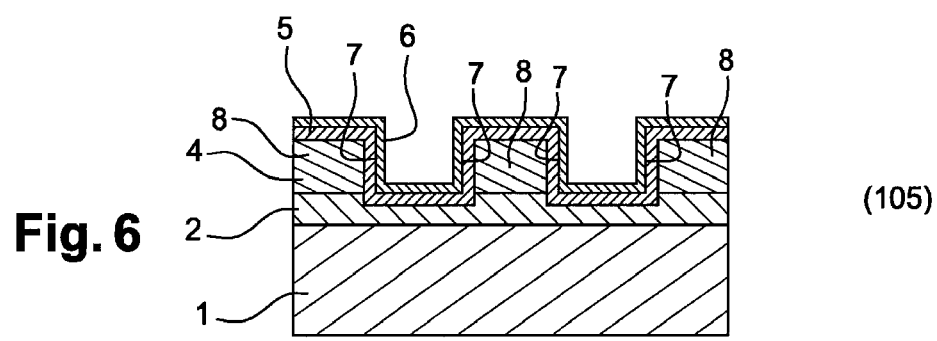
Fig. 6 (105)
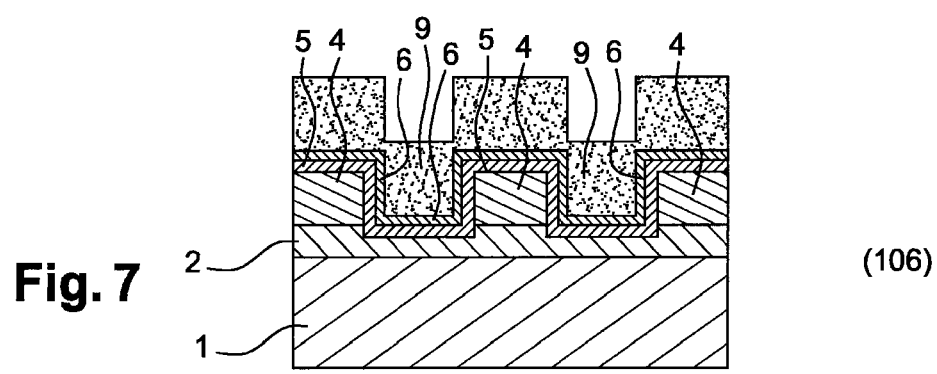
Fig. 7 (106)
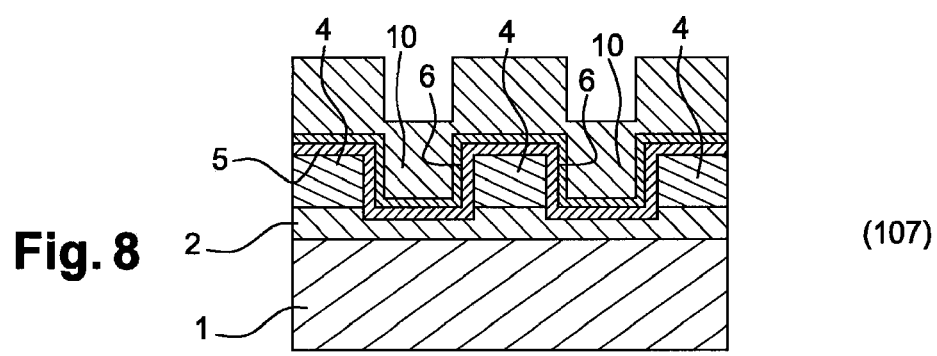
Fig. 8 (107)

METHOD FOR MAKING PATTERNS ON THE SURFACE OF A SUBSTRATE USING BLOCK COPOLYMERS

CROSS-REFERENCE TO RELATED APPLICATIONS

This is the U.S. National Stage of PCT/EP2012/059295, filed May 18, 2012, which in turn claims priority to French Patent Application No. 1154675, filed May 27, 2011, the entire contents of all applications are incorporated herein by reference in their entireties.

TECHNICAL FIELD

The present invention relates to a method for making patterns on the surface of a substrate using block copolymers in order to generate patterns of very high resolution and density. The invention relates more particularly to a graphoepitaxy method using block copolymers.

PRIOR ART

The need for methods for making objects having nanometric patterns has significantly increased over the last ten years, due to the trend towards the miniaturisation of components.

Initially, the patterns were produced by optical lithography. In this production method, the resolution is proportional to the wavelength and inversely proportional to the numerical aperture, such that the resolution obtained by this method is limited.

In order to obtain better resolutions, new methods of making patterns have been developed such as "double patterning", extreme UV lithography, lithography by electrons or graphoepitaxy which uses block copolymers.

Block copolymers are polymers in which there are two repeating units: a monomer A and a monomer B, the monomer A forming a chain, the monomer B forming a chain, said two chains being bound together by a covalent bond. When sufficient mobility is given to the chains, for example by heating these block copolymers, the chain A and the chain B have a tendency to separate into phases and to reorganise themselves into specific conformations, and which depends in particular on the ratio between the monomer A and the monomer B. As a function of this ratio, one may for example have spheres of A in a matrix of B, or instead cylinders of A in a matrix of B, or instead intercalated strips of A and strips of B. Block copolymers thus have the property of forming patterns which can be controlled by means of the ratio of monomers A and B.

Furthermore, the periodicity of the patterns formed by block copolymers is directly linked to the molar mass of the block copolymers, such that by controlling said molar mass, the resolution of the patterns that they form can be controlled.

Recently, these properties of block copolymers have thus been used within the scope of graphoepitaxy methods so as to form patterns of very high resolution, for example of the order of ten or so nanometres.

Graphoepitaxy methods of the prior art generally consist in making primary patterns on the surface of a substrate, said primary patterns defining zones within which block copolymers are going to be deposited to form secondary patterns of better resolution within these zones.

Block copolymers are generally deposited by spin coating; consequently, the primary patterns need to resist the solvent with which the block copolymers are mixed.

Furthermore, following the deposition of the block copolymers, the latter are annealed so that they reorganise themselves and form the desired patterns. Consequently, the primary patterns must also have an excellent temperature resistance.

Such a method is for example described in the document "Ultralarge-area block copolymer lithography via soft graphoepitaxy" (JEONG et al.).

In order to ensure the primary patterns have a good temperature and solvent resistance, the document "Graphoepitaxial assembly of symmetric block copolymers on weakly preferential substrates" (Han et al.—Advanced Materials—2010, 22, 4325-4329) proposes making patterns in the resin by optical lithography, then transferring said resin patterns into a rigid substrate, for example made of silicon.

Thus, the patterns formed in the rigid substrate resist both solvent and temperature. Nevertheless, the step of transfer of the resin patterns into the rigid substrate complicates the graphoepitaxy method. Another solution for having primary patterns that resist both solvent and temperature is disclosed in the publication of Cheng et al., ACS Nano, Vol. 4, NO. 8, 4815-4823, IBM Almaden Research Center, which proposes making resin patterns by optical lithography, then treating said resin patterns so as to cure them by depositing a protective layer (also known as "top coat") on the resin patterns. Nevertheless, this step of depositing a protective layer also complicates the graphoepitaxy method and increases its cost.

In all the methods mentioned above, the domains of block copolymer obtained are oriented parallel to the resin pattern (i.e. in the direction of the long length of the resin pattern).

DESCRIPTION OF THE INVENTION

The invention aims to overcome the drawbacks of the prior art by proposing a simplified graphoepitaxy method making it possible in particular to obtain different geometries of domains compared to domains oriented parallel to the resin pattern, for example domains perpendicular to the sides of the patterns (i.e. in the direction of the short length of the resin pattern) or perpendicular to the substrate.

To do so, according to a first aspect of the invention, a method for making patterns on the surface of a substrate by graphoepitaxy is proposed comprising the following steps:
- a step of depositing a layer of resin onto the surface of the substrate;
- a step of making patterns in the resin on the surface of a substrate;
- a step of curing the patterns in the resin by producing a layer of amorphous carbon on the surface of the patterns in the resin;
- a step of depositing a layer of random copolymer after the step of curing the patterns in the resin;
- a step of grafting the layer of random copolymer onto the patterns in the resin by annealing;
- a step of depositing a layer of block copolymer into the spaces defined by the patterns in the resin after the step of curing the patterns and the grafting of the layer of random copolymer.

The random copolymer makes it possible to neutralise the surface on which will be deposited the block copolymer, in other words that the energies of interaction of each block of the block copolymer with the substrate will be the same. The surface neutralisation favours in particular the arrangement of the domains of the block copolymer perpendicularly on the surface on which it will be deposited. The random copolymer is preferably composed of the same monomers as those which compose the block copolymer.

The step of depositing the layer of random copolymer takes place after the step of curing (i.e. hardening) the pattern in the resin. In fact, the fact of creating a layer of amorphous carbon on the pattern in the resin makes it possible to graft more easily the layer of random copolymer onto the pattern in the resin, which was not the case with the methods of the prior art. New geometries of patterns may thus be made with the block copolymer, for example by favouring the arrangement of domains perpendicular to the sides of the patterns in the resin (i.e. in the direction of the short length of the pattern in the resin) when a lamellar block copolymer is used, which was not the case with the methods of the prior art. Cylinders organised and perpendicular to the substrate may also be obtained by using cylindrical block copolymers.

The method according to the invention moreover makes it possible to cure the pattern in the resin by means of a step of producing amorphous carbon (also known as graphite, these two expressions being indiscriminately employed in the remainder of the document) on the surface of the pattern in the resin. The pattern in the resin consequently becomes resistant to temperatures going up to 350° C. Furthermore, the fact of producing amorphous carbon on the surface of the pattern in the resin renders it resistant to solvent. The pattern in the resin thus no longer needs to be transferred into a hard mask. The amorphous copolymer may then be deposited by spin coating without the solvent used deteriorating the pattern in the resin. Furthermore, the pattern in the resin is no longer deteriorated by annealings. This layer of graphite has a thickness of several nanometres, typically comprised between 1 and 5 nm, for example 3 nm.

The method according to the invention may also comprise one or more of the characteristics hereafter taken individually or according to all technically possible combinations thereof.

According to different embodiments, the step of curing the pattern in the resin may be:
- a step of treating the pattern in the resin by a plasma; said plasma may be an argon Ar, helium He, hydrogen $H_2$ plasma. Said plasma is preferably a hydrobromic acid HBr plasma. In fact, the creation of the layer of amorphous carbon with a HBr plasma is very rapid, and the layer of amorphous carbon thereby produced is sufficiently thick so that the pattern in the resin is resistant to solvents and to annealings.
- a step of bombarding the pattern in the resin with ions such as argon or helium ions.

According to an embodiment, the pattern in the resin is formed by optical lithography of the layer of resin.

Advantageously, the method further comprises a step of depositing an anti-reflective layer prior to the step of making the pattern in the resin. This anti-reflective layer makes it possible to avoid destructive interferences during the optical lithography. When the pattern in the resin is subjected to a HBr plasma or to a bombardment of helium or argon ions, the antireflective layer is also subjected to this HBr plasma or to this bombardment of helium or argon ions, so that its surface is also graphitised. Thus, it is then possible to graft the random copolymer also onto the surface of the antireflective layer.

Advantageously, the method comprises, following the step of depositing the layer of block copolymer, a step of reorganising the layer of block copolymer by annealing. This step makes it possible to produce patterns of very good resolution from the block copolymer.

Advantageously, the method further comprises, following the step of reorganising the layer of block copolymer, a step of eliminating one of the phases of the layer of reorganised block copolymer for example by oxygen treatment or instead by treatment with acetic acid.

BRIEF DESCRIPTION OF DRAWINGS

Other characteristics and advantages of the invention will become clearer on reading the detailed description that follows, with reference to the appended figures, which illustrate:

FIGS. 1 to 10, a method according to a first embodiment of carrying out the invention.

For greater clarity, identical or similar elements are marked by identical reference signs in all of the figures.

DETAILED DESCRIPTION OF AT LEAST ONE EMBODIMENT

Figure 9:
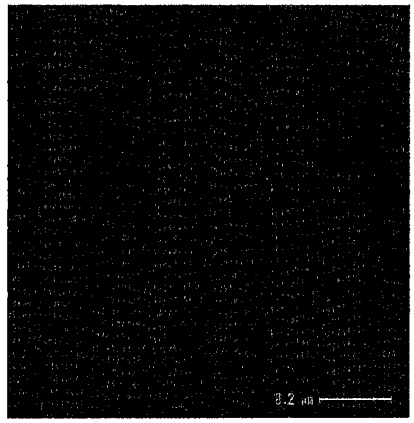

A method for making a pattern on the surface of a substrate 1 by graphoepitaxy according to an embodiment of realising the invention will now be described with reference to the figures.

The method firstly comprises a step 101 of depositing an antireflective layer 2 on the surface of the substrate 1. This antireflective layer 2 is preferably deposited by spin coating. This antireflective layer 2 is for example a BARC (Bottom Anti-Reflective Coating) layer, a DARC (Dielectric Anti-Reflective Coating) layer, a SiARC (Silicon layer containing an Anti-Reflective Coating) layer, or a stack of the latter layers. After the deposition, the layer is annealed in order to cross link it.

The method comprises a step 102 of depositing a layer of resin 3 on the surface of the antireflective layer 2. This layer of resin 3 is also deposited by spin coating.

The method then comprises a step 103 of lithography of the layer of resin 3 so as to make patterns in the resin 4.

The method then comprises a step 104 of curing the patterns in the resin 4 by producing a layer of amorphous carbon 5 on the surface of the patterns in the resin 4.

According to a first embodiment, this step 104 of curing the patterns in the resin 4 by producing a layer of amorphous carbon 5 on the surface of the patterns in the resin may be carried out by placing the patterns in the resin 4 in a plasma etching. This plasma is preferably a HBr (hydrobromic acid) plasma. This step of etching patterns in the resin by HBr plasma is preferably carried out under a pressure comprised between 1-100 mT and a temperature comprised between 40° C. and 100° C. The flow rate of HBr gas bombarded on the patterns in the resin is preferably comprised between 50 and 500 sccm (1 sccm=1 $cm^3$/min). The etching device used preferably has a power comprised between 100 and 1500 W. The plasma is formed for a duration typically comprised between 30 and 100 seconds, for example 60 seconds. Those skilled in the art will know how to adapt these conditions to obtain a layer of graphite of sufficient thickness typically comprised between 1 and 5 nanometres.

According to a second embodiment, this step 104 of curing the patterns in the resin 4 by producing a layer of amorphous carbon 5 on the surface of the patterns in the resin may be carried out by bombarding helium or argon ions onto the patterns in the resin 4. In this case, the patterns in the resin 4 are subjected to ion implantation treatments using ionic species such as He or Ar, with an energy between 1 and 5 eV, and for vacuums of the order of 5 e-7 to 5 e-6 torr. The implanted dose will be adapted by those skilled in the art, using available simulation software (for example SRIM software), to obtain an implantation profile enabling a layer of graphite of the required thickness to be obtained on the surface.

In both cases, this step of curing the patterns in the resin by producing a layer of amorphous carbon on the surface of the patterns in the resin 4 enables the patterns in the resin 4 to resist both the solvents used for the deposition by spin coating and to annealings going up to 350° C. Furthermore, during this step, amorphous carbon is produced on the surface of the patterns in the resin, but also at the surface of the antireflective layer 2, and more generally on the surface of any layer made of organic material, which makes it possible to solidify these layers, but also to favour the subsequent grafting of a layer of random copolymer, as will be seen hereafter.

The method then comprises a step of grafting 105 a layer of random copolymer 6.

In the present case, this layer of random copolymer 6 is a layer of PS-r-PMMA which comprises 70% by volume of PS, or polystyrene, and 30% of PMMA, polymethylmethacrylate.

This layer of random copolymer 6 is firstly spread by spin coating by diluting the random copolymer in a suitable solvent, toluene for example. More precisely, preferably 1.5% by weight of PS-r-PMMA is mixed in toluene.

The layer of random copolymer 6 is then thermally grafted by annealing, in the present case at 180° C. for 48 hours under inert atmosphere.

The sample is then rinsed in toluene.

A monolayer of random copolymer 6 is thereby grafted onto the hardened resin, without the step of grafting of this monolayer having damaged the patterns in the resin.

Furthermore, the grafting of the layer of random copolymer is favoured by the presence of the layer of amorphous carbon.

Thus, in the present case, the monolayer of random copolymer 6 is grafted not only onto the sides 7 of the patterns in the resin 4, but also onto the antireflective layer 2, between two successive patterns in the resin 4 and onto the patterns in the resin 4.

This layer of random copolymer 6 makes it possible to neutralise the surfaces on which it is deposited so as to favour the perpendicular arrangement of the domains that will be produced thereafter.

The method then comprises a step 106 of depositing a block copolymer 9 into the spaces defined by the patterns in the resin 4 as well as on the patterns in the resin 4. The block copolymer 9 is preferably composed of the same monomers as the random copolymer that has been deposited previously.

In the present case, the block copolymer 9 used is a lamellar PS-b-PMMA block copolymer containing respectively 50% by volume of polystyrene PS and 50% by volume of polymethylmethacrylate or PMMA.

This block copolymer 9 is spread out by spin coating, using for example a 1.5% solution by weight of block copolymer diluted in toluene. The block copolymer is heated to 240° C. for 10 minutes. The block copolymer then reorganises itself, particularly as a function of the ratio between the polystyrene monomer and the polymethylmethacrylate monomer. Thus, strips of polystyrene and strips of polymethylmethacrylate are obtained. It will be noted that the block copolymer reorganises itself as much in the spaces between the patterns of resin 4 as on the patterns of resin 4.

The method then comprises a step 107 of eliminating one of the phases of the layer of reorganised block copolymer 10, here the polymethylmethacrylate phase. To do so, the layer of reorganised block copolymer 10 is immersed in 99% concentrated acetic acid for 10 minutes.

Polystyrene patterns are thereby obtained, represented in FIG. 9, of very high resolution since the resolution of the patterns obtained is of the same order of magnitude as the length of the chains of monomers of the block copolymer used. The patterns thereby obtained are then used to etch the substrate through openings left between the patterns; at the level of openings situated above the patterns in the resin, these openings emerge into the resin and the substrate is thus not etched at this level (i.e. above the patterns in the resin). The reorganised block copolymer and the resin are then eliminated to only conserve the etched substrate at the level of the spaces between the plots of resin.

Furthermore, the orientation of these patterns depends on the layer of random copolymer 30 and on the place where this layer has been deposited. Thus, in FIG. 9, patterns that extend transversally between two patterns of resin have been obtained, because the layer of random copolymer had also been deposited on the sides of the patterns in the resin.

Figure 10:
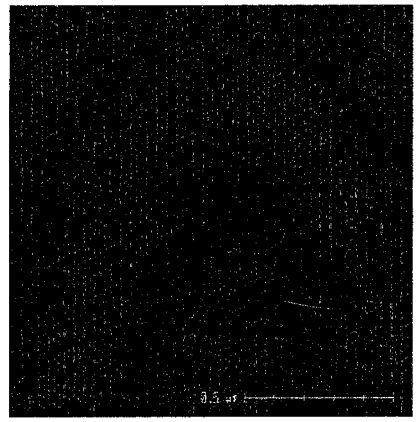

Instead of obtaining strips thanks to the block copolymer, as represented in FIG. 9, other patterns could be obtained. Thus, if during the step 106 of depositing a block copolymer, a cylindrical PS-b-PMMA block copolymer containing respectively 70% by volume of polystyrene PS and 30% by volume of polymethylmethacrylate or PMMA is used instead of lamellar copolymer, one obtains following step 107 cylinders perpendicular to the substrate, as represented in FIG. 10. In this case, a regular arrangement of cylinders is obtained over the whole surface of the substrate. Once the etching of the substrate through the spaces between the cylinders has been carried out, a regular arrangement of holes is obtained in the substrate. It should be noted here that the absence of random copolymer over the whole surface (particularly on the patterns in the resin or on the sides) would lead to a break in the regular arrangement at the level of the sides of the patterns in the resin so that, after etching, a regular arrangement would be obtained in the zones between each resin pattern but not from one zone to another: the presence of random copolymer over the whole surface made possible thanks to the prior production of a layer of amorphous carbon is thus advantageous to obtain a regular arrangement of patterns transferred by etching into the substrate.

Naturally, the invention is not limited to the embodiments described with reference to the figures and variants could be envisaged without going beyond the scope of the invention. Thus, the invention is not limited to the block copolymers given by way of example, or to the cited random copolymers.

The invention claimed is:

1. Method for making patterns on the surface of a substrate by graphoepitaxy comprising:
    depositing a layer of resin on the surface of the substrate;
    making patterns in the resin on the surface of the substrate;
    producing a layer of amorphous carbon on the surface of the patterns in the resin;
    depositing a layer of random copolymer after producing the layer of amorphous carbon on the surface of the patterns in the resin;
    grafting the layer of random copolymer onto the patterns in the resin, between the patterns in the resin and onto sides of the patterns in the resin, by annealing;

depositing a layer of block copolymer into spaces defined by the patterns in the resin after the grafting.

2. Method according to claim 1, wherein the patterns in the resin are cured by treating the patterns in the resin by a gaseous plasma.

3. Method according to claim 2, wherein the gaseous plasma is a HBr plasma.

4. Method according to claim 1, wherein the patterns in the resin are cured by bombarding the patterns in the resin with ions.

5. Method according to claim 4, wherein the ions are helium or argon ions.

6. Method according to claim 1, wherein the patterns in the resin are formed by optical lithography of the layer of resin.

7. Method according to claim 1, further comprising depositing an antireflective layer on the surface of the substrate.

8. Method according to claim 1 further comprising, following the depositing of the layer of block copolymer, reorganising the layer of block copolymer by annealing.

9. Method according to claim 8, further comprising, following the reorganising, eliminating one of the phases of the layer of reorganised block copolymer.

10. Method according to claim 1 wherein the random copolymer is composed of the same monomers as those which compose the block copolymer.

11. Method according to claim 1 wherein the block copolymer is a lamellar block copolymer.

12. Method according to claim 1, wherein the block copolymer is a cylindrical block copolymer.

13. Method according to claim 1, wherein the layer of random copolymer is grafted onto a top of the patterns in the resin.

* * * * *